(12) United States Patent
Ban et al.

(10) Patent No.: US 11,245,037 B2
(45) Date of Patent: Feb. 8, 2022

(54) METHOD OF FABRICATING ARRAY SUBSTRATE, ARRAY SUBSTRATE, AND DISPLAY APPARATUS

(71) Applicant: BOE Technology Group Co., Ltd., Beijing (CN)

(72) Inventors: Shengguang Ban, Beijing (CN); Zhanfeng Cao, Beijing (CN); Qi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 94 days.

(21) Appl. No.: 16/616,965

(22) PCT Filed: Jun. 19, 2018

(86) PCT No.: PCT/CN2018/091784
§ 371 (c)(1),
(2) Date: Nov. 25, 2019

(87) PCT Pub. No.: WO2019/041976
PCT Pub. Date: Mar. 7, 2019

(65) Prior Publication Data
US 2020/0168745 A1    May 28, 2020

(30) Foreign Application Priority Data
Aug. 31, 2017 (CN) .......................... 201710772525.0

(51) Int. Cl.
*H01L 29/786* (2006.01)
*H01L 29/66* (2006.01)
(Continued)

(52) U.S. Cl.
CPC .. *H01L 29/78633* (2013.01); *H01L 29/66757* (2013.01); *H01L 29/78675* (2013.01);
(Continued)

(58) Field of Classification Search
None
See application file for complete search history.

(56) References Cited

U.S. PATENT DOCUMENTS 9,368,637 B2 * 6/2016 Zhang ................. H01L 29/7869
2016/0246139 A1 * 8/2016 Li ...................... H01L 29/78633
(Continued)

FOREIGN PATENT DOCUMENTS

| CN | 101022085 A | 8/2007 |
| CN | 101409230 A | 4/2009 |

(Continued)

OTHER PUBLICATIONS

International Search Report & Written Opinion dated Sep. 19, 2018, regarding PCT/CN2018/091784.
(Continued)

*Primary Examiner* — Alexander G Ghyka
(74) *Attorney, Agent, or Firm* — Intellectual Valley Law, P.C.

(57) ABSTRACT

The present application provides an array substrate. The array substrate includes a base substrate; a light shielding layer on the base substrate; a metal oxide layer on a side of the light shielding layer distal to the base substrate; and an active layer on a side of the metal oxide layer distal to the base substrate. The metal oxide layer includes a metal oxide material. The light shielding layer includes amorphous silicon. An orthographic projection of the light shielding layer on the base substrate substantially overlaps with an orthographic projection of the active layer on the base substrate, and substantially overlaps with an orthographic projection of the metal oxide layer on the base substrate.

20 Claims, 3 Drawing Sheets

(51) Int. Cl.
  *H01L 21/02* (2006.01)
  *H01L 27/12* (2006.01)
(52) U.S. Cl.
  CPC .... *H01L 21/0245* (2013.01); *H01L 21/02178* (2013.01); *H01L 21/02244* (2013.01); *H01L 21/02488* (2013.01); *H01L 21/02502* (2013.01); *H01L 21/02513* (2013.01); *H01L 21/02532* (2013.01); *H01L 21/02592* (2013.01); *H01L 21/02675* (2013.01); *H01L 27/1214* (2013.01)

(56) References Cited

U.S. PATENT DOCUMENTS

| | | | | |
|---|---|---|---|---|
| 2016/0343747 | A1* | 11/2016 | Du | H01L 29/78633 |
| 2017/0307920 | A1* | 10/2017 | Chung | G02F 1/136227 |
| 2018/0047830 | A1 | 2/2018 | Lu | |
| 2018/0182897 | A1 | 6/2018 | Shu et al. | |

FOREIGN PATENT DOCUMENTS

| | | |
|---|---|---|
| CN | 104536192 A | 4/2015 |
| CN | 105185714 A | 12/2015 |
| CN | 105374882 A | 3/2016 |
| CN | 105870201 A | 8/2016 |
| CN | 107104110 A | 8/2017 |
| JP | 2010003874 A | 1/2010 |

OTHER PUBLICATIONS

First Office Action in the Chinese Patent Application No. 201710772525.0, dated Jun. 4, 2019; English translation attached.
Second Office Action in the Chinese Patent Application No. 201710772525.0, dated Dec. 3, 2019; English translation attached.
Third Office Action in the Chinese Patent Application No. 201710772525.0, dated Mar. 27, 2020; English translation attached.

* cited by examiner forming a metallic material layer on a side of the amorphous silicon layer distal to the first buffer layer

⇓ oxidizing the metallic material layer, thereby forming the metal oxide material layer

FIG. 3 forming a second amorphous silicon layer on a side of the second buffer layer distal to the metal oxide material layer

⇓ crystallizing the second amorphous silicon layer to form a polycrystalline silicon layer

FIG. 4

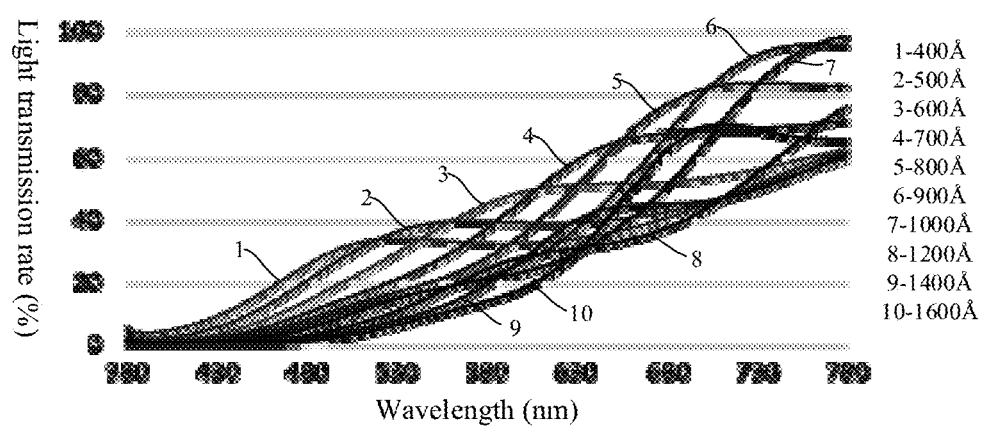

FIG. 5

METHOD OF FABRICATING ARRAY SUBSTRATE, ARRAY SUBSTRATE, AND DISPLAY APPARATUS

CROSS-REFERENCE TO RELATED APPLICATION

This application is a national stage application under 35 U.S.C. § 371 of International Application No. PCT/CN2018/091784, filed Jun. 19, 2018, which claims priority to Chinese Patent Application No. 201710772525.0, filed Aug. 31, 2017, the contents of which are incorporated by reference in the entirety.

TECHNICAL FIELD

The present invention relates to display technology, more particularly, to a method of fabricating an array substrate, an array substrate, and a display apparatus.

BACKGROUND

One of the most important factor affecting the electronic properties of a display panel is the mobility rate of its semiconductor material. Polysilicon has a higher mobility rate and stability than amorphous silicon. Low temperature polycrystalline silicon (LTPS) thin film transistors have found a wide range of applications in display field. A low temperature polysilicon display apparatus has the advantage of being energy efficient. Development of a new generation of low temperature polycrystalline silicon display apparatus has become the focus of research in display technology.

SUMMARY

In one aspect, the present invention provides an array substrate comprising a base substrate; a light shielding layer on the base substrate; a metal oxide layer on a side of the light shielding layer distal to the base substrate; and an active layer on a side of the metal oxide layer distal to the base substrate; wherein the metal oxide layer comprises a metal oxide material; the light shielding layer comprises amorphous silicon; and an orthographic projection of the light shielding layer on the base substrate substantially overlaps with an orthographic projection of the active layer on the base substrate, and substantially overlaps with an orthographic projection of the metal oxide layer on the base substrate.

Optionally, the light shielding layer has a thickness in a range of approximately 700 Å to approximately 1200 Å.

Optionally, the metal oxide layer has a thickness in a range of approximately 100 Å to approximately 1000 Å.

Optionally, the array substrate further comprises a first buffer layer between the light shielding layer and the base substrate.

Optionally, the first buffer layer comprises one or a combination of silicon oxide and silicon nitride.

Optionally, the array substrate further comprises a second buffer layer between the metal oxide layer and the active layer.

Optionally, the second buffer layer has a thickness in a range of approximately 1000 Å to approximately 3000 Å.

Optionally, the second buffer layer comprises silicon oxide.

Optionally, the metal oxide layer comprises aluminum oxide.

Optionally, the active layer comprises polycrystalline silicon.

In another aspect, the present invention provides a display apparatus comprising the array substrate described herein or fabricated by a method described herein.

In another aspect, the present invention provides a method of fabricating an array substrate, comprising forming a first amorphous silicon layer on a base substrate; forming a metal oxide material layer on a side of the first amorphous silicon layer distal to the base substrate; and forming a polycrystalline silicon layer on a side of the metal oxide material layer distal to the first amorphous silicon layer.

Optionally, the method further comprises patterning the first amorphous silicon layer, the metal oxide material layer, and the polycrystalline silicon layer in a single patterning process, thereby forming a light shielding layer on the base substrate, and an active layer on a side of the light shielding layer distal to the base substrate.

Optionally, forming the metal oxide material layer comprises forming a metallic material layer on a side of the first amorphous silicon layer distal to the base substrate; and oxidizing the metallic material layer to form the metal oxide material layer.

Optionally, the metallic material layer is made of aluminum, and the metal oxide material layer comprises aluminum oxide.

Optionally, oxidizing the metallic material layer comprises annealing the metallic material layer in an oxygen-containing atmosphere.

Optionally, the metal oxide material layer has a thickness in a range of approximately 100 Å to approximately 1000 Å.

Optionally, the metal oxide material layer comprises aluminum oxide.

Optionally, prior to forming the first amorphous silicon layer, further comprising forming a first buffer layer on a side first amorphous silicon layer distal to the base substrate.

Optionally, the first buffer layer comprises one or a combination of silicon oxide and silicon nitride.

Optionally, forming the polycrystalline silicon layer comprises forming a second amorphous silicon layer on a side of the metal oxide material layer distal to the first amorphous silicon layer; and crystallizing the second amorphous silicon layer to form the polycrystalline silicon layer.

Optionally, crystallizing the second amorphous silicon layer is performed by excimer laser annealing.

Optionally, subsequent to forming the second amorphous silicon layer, further comprising forming a second buffer layer on a side of the second amorphous silicon layer distal to the metal oxide material layer.

Optionally, the second buffer layer comprises silicon oxide; and the second buffer layer has a thickness in a range of approximately 1000 Å to approximately 3000 Å.

Optionally, the light shielding layer has a thickness in a range of approximately 700 Å to approximately 1200 Å.

BRIEF DESCRIPTION OF THE FIGURES

The following drawings are merely examples for illustrative purposes according to various disclosed embodiments and are not intended to limit the scope of the present invention.

FIG. 3 is a flow chart illustrating a method of fabricating an array substrate in some embodiments according to the present disclosure.

FIG. 4 is a flow chart illustrating a method of fabricating an array substrate in some embodiments according to the present disclosure.

FIG. 5 illustrates a correspondence relationship between wavelengths and light transmission rates of amorphous silicon layers of various thicknesses.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Conventional fabrication methods of low temperature polycrystalline silicon display apparatus require a complicated patterning process involving up to 11 patterning steps (e.g., using up to 11 mask plates). The highly complexed patterning process limits the fabrication efficiency of the array substrate and increases the manufacturing costs.

Accordingly, the present disclosure provides, inter alia, a method of fabricating an array substrate, an array substrate, and a display apparatus that substantially obviate one or more of the problems due to limitations and disadvantages of the related art. In one aspect, the present disclosure provides a method of fabricating an array substrate. In some embodiments, the method includes forming a first amorphous silicon layer on a base substrate; forming a metal oxide material layer on a side of the first amorphous silicon layer distal to the base substrate; forming a polycrystalline silicon layer on a side of the metal oxide material layer distal to the first amorphous silicon layer; and patterning the first amorphous silicon layer, the metal oxide material layer, and the polycrystalline silicon layer in a single patterning process, thereby forming a light shielding layer on the base substrate, a protective layer on a side of the light shielding layer distal to the base substrate, and an active layer on a side of the protective layer distal to the light shielding layer.

Figure 1:
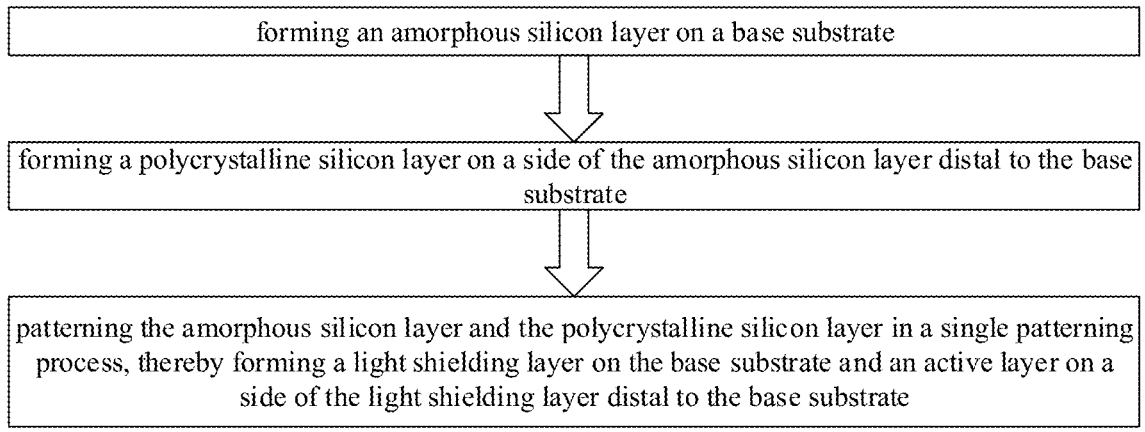
FIG. 1 is a flow chart illustrating a method of fabricating an array substrate in some embodiments according to the present disclosure.

FIG. 1 is a flow chart illustrating a method of fabricating an array substrate in some embodiments according to the present disclosure. Referring to FIG. 1, the method in some embodiments includes forming a first amorphous silicon layer on a base substrate, forming a polycrystalline silicon layer on a side of the first amorphous silicon layer distal to the base substrate, patterning the first amorphous silicon layer and the polycrystalline silicon layer in a single patterning process, thereby forming a light shielding layer on the base substrate and an active layer on a side of the light shielding layer distal to the base substrate. An orthographic projection of the light shielding layer on the base substrate substantially overlaps with an orthographic projection of the active layer on the base substrate.

Figure 2:
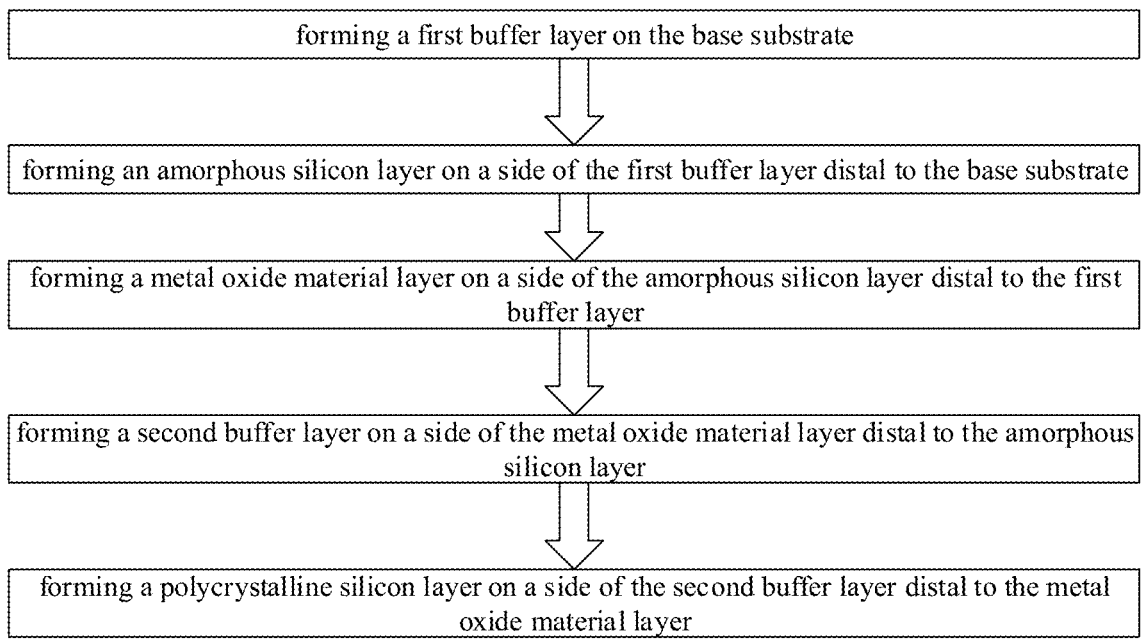
FIG. 2 is a flow chart illustrating a method of fabricating an array substrate in some embodiments according to the present disclosure.

FIG. 2 is a flow chart illustrating a method of fabricating an array substrate in some embodiments according to the present disclosure. Referring to FIG. 2, the method in some embodiments includes forming a first buffer layer on the base substrate; forming a first amorphous silicon layer on a side of the first buffer layer distal to the base substrate; forming a metal oxide material layer on a side of the first amorphous silicon layer distal to the first buffer layer; forming a second buffer layer on a side of the metal oxide material layer distal to the first amorphous silicon layer; and forming a polycrystalline silicon layer on a side of the second buffer layer distal to the metal oxide material layer. Subsequently, the method further includes patterning the first amorphous silicon layer, the metal oxide material layer, and the polycrystalline silicon layer in a single patterning process, thereby forming a light shielding layer on the base substrate, a protective layer on a side of the light shielding layer distal to the base substrate, and an active layer on a side of the protective layer distal to the light shielding layer. The light shielding layer includes amorphous silicon. The protective layer includes a metal oxide material.

Various appropriate materials may be used for making the base substrate. Examples of materials suitable for making the base substrate include, but are not limited to, glass, quartz, polyimide, and polyester, etc. Optionally, the base substrate is a flexible base substrate (e.g., polyimide base substrate). Optionally, the base substrate is a relatively inflexible base substrate (e.g., a glass base substrate).

Various appropriate materials and various appropriate fabricating methods may be used for making the first buffer layer. For example, an insulating material may be deposited on the substrate by a plasma-enhanced chemical vapor deposition (PECVD) process and patterned. Examples of materials suitable for making the buffer layer include, but are not limited to, silicon oxide ($SiO_x$), silicon nitride ($SiN_x$), or a combination thereof. Optionally, the first buffer layer is a single-layer structure. Optionally, the first buffer layer is a multi-layer structure including a plurality of sub-layers. Optionally, the first buffer layer includes a silicon oxide sub-layer and a silicon nitride sub-layer. Optionally, the thickness of the first buffer layer is in the range of approximately 1500 Å to approximately 2500 Å, e.g., approximately 1500 Å to approximately 1750 Å, approximately 1750 Å to approximately 2000 Å, approximately 2000 Å to approximately 2250 Å, and approximately 2250 Å to approximately 2500 Å. The first buffer layer functions to shield defects in the base substrate and prevent diffusion of contaminates (e.g., metal ions) from the base substrate.

Various appropriate materials and various appropriate fabricating methods may be used for making the first amorphous silicon layer. For example, an amorphous silicon material may be deposited on the substrate by a plasma-enhanced chemical vapor deposition (PECVD) process and patterned. Optionally, the thickness of the first amorphous silicon layer is in the range of approximately 700 Å to approximately 1200 Å, e.g., approximately 700 Å to approximately 800 Å, approximately 800 Å to approximately 900 Å, approximately 900 Å to approximately 1000 Å, approximately 1000 Å to approximately 1100 Å, and approximately 1100 Å to approximately 1200 Å. The first amorphous silicon layer is subsequently patterned to form a light shielding layer.

In some embodiments, the first amorphous silicon layer as described above is patterned to form a light shielding layer. In some embodiments, a second amorphous silicon layer is formed on a side of the first amorphous silicon layer distal to the base substrate, the second amorphous silicon layer is then crystallized to form a polycrystalline silicon layer. The crystallization step may be performed utilizing any appropriate crystallization method. In some embodiments, the crystallization step is performed utilizing a method selected from the group consisting of excimer laser annealing (ELA), solid phase crystallization (SPC), sequential lateral solidification (SLS), metal induced crystallization (MIC), and metal-induced lateral crystallization (MILC). Optionally, the crystallization step is performed using excimer laser annealing. In one example, the second amorphous silicon layer is crystallized using an excimer laser annealing (ELA) process.

During the crystallization, heat generated during the crystallization process of the second amorphous silicon layer is transferred to the first amorphous silicon layer. The heat loss results in defective crystallization, particular around the bottom side of the second amorphous silicon layer. Moreover, the first amorphous silicon layer has a relatively high hydrogen content, this may result in hydrogen explosion in the second amorphous silicon layer during the crystallization process. The hydrogen explosion issue may be partially alleviated by having a second buffer layer of a relatively large thickness between the first amorphous silicon layer and the second amorphous silicon layer, by creating a barrier to prevent heat transfer and hydrogen transfer. However, a second buffer layer of a relatively large thickness makes it difficult for subsequent etching process, lowering the fabrication efficiency. In the present method, a metal oxide material layer is formed between the first amorphous silicon layer and the second amorphous silicon layer. The metal oxide material layer is made of a metal oxide material having a lower thermal conductivity and higher hermeticity as compared to the second buffer layer, effectively preventing heat and hydrogen transfer during the crystallization process. By having the metal oxide material layer, the present method obviates the need to have a second buffer layer of a relatively large thickness between the first amorphous silicon layer and the second amorphous silicon layer.

Various appropriate materials and various appropriate fabricating methods may be used for making the metal oxide material layer. Examples of appropriate materials for making the metal oxide material layer include metal oxides such as aluminum oxide, magnesium oxide, hafnium oxide, zirconium oxide, zinc oxide, gallium oxide, indium oxide, tin oxide, titanium oxide, molybdenum oxide, yttrium oxide, barium oxide, or a combination thereof.

FIG. 3 is a flow chart illustrating a method of fabricating an array substrate in some embodiments according to the present disclosure. Referring to FIG. 3, the step of forming the metal oxide material layer in some embodiments includes forming a metallic material layer on a side of the amorphous silicon layer distal to the first buffer layer; and oxidizing the metallic material layer, thereby forming the metal oxide material layer. Optionally, the metallic material layer is a layer including aluminum, and the metal oxide material layer is a layer containing aluminum oxide. Optionally, the metallic material layer is formed by sputtering. Optionally, the step of oxidizing the metallic material layer is performed by annealing the metallic material layer in an oxygen-containing atmosphere.

Various appropriate materials and various appropriate fabricating methods may be used for making the metallic material layer. Examples of appropriate materials for making the metallic material layer include aluminum, magnesium, hafnium, zirconium, zinc, gallium, indium, tin, titanium, molybdenum, yttrium, barium, and laminates and alloys thereof.

Optionally, the thickness of the metal oxide material layer (and the protective layer formed by patterning the metal oxide material layer) is in the range of approximately 100 Å to approximately 1000 Å, e.g., approximately 100 Å to approximately 200 Å, approximately 200 Å to approximately 300 Å, approximately 300 Å to approximately 400 Å, approximately 400 Å to approximately 500 Å, approximately 500 Å to approximately 600 Å, approximately 600 Å to approximately 700 Å, approximately 700 Å to approximately 800 Å, approximately 800 Å to approximately 900 Å, and approximately 900 Å to approximately 1000 Å.

Various appropriate materials and various appropriate fabricating methods may be used for making the second buffer layer. For example, an insulating material may be deposited on the substrate by a plasma-enhanced chemical vapor deposition (PECVD) process and patterned. Examples of other materials suitable for making the buffer layer include, but are not limited to, silicon oxide ($SiO_x$), silicon nitride ($SiN_x$), or a combination thereof. Optionally, the second buffer layer is made of silicon oxide. Because silicon oxide has a crystalline lattice compatible with that of the polycrystalline silicon, using silicon oxide as the second buffer layer material results in significantly fewer interface defects between the second buffer layer and the polycrystalline silicon layer, and can greatly improve the crystalline quality of the polycrystalline silicon layer.

Because an array substrate fabricated by the present method includes a metal oxide material layer for preventing heat and hydrogen transfer, the thickness of the second buffer layer can be maintain relatively small. Optionally, the thickness of the second buffer layer is in the range of approximately 1000 Å to approximately 3000 Å, e.g., approximately 1000 Å to approximately 1500 Å, approximately 1500 Å to approximately 2000 Å, approximately 2000 Å to approximately 2500 Å, and approximately 2500 Å to approximately 3000 Å.

FIG. 4 is a flow chart illustrating a method of fabricating an array substrate in some embodiments according to the present disclosure. Referring to FIG. 4, the step of forming the polycrystalline silicon layer in some embodiments includes forming a second amorphous silicon layer on a side of the second buffer layer distal to the metal oxide material layer; and crystallizing the second amorphous silicon layer to form a polycrystalline silicon layer.

Various appropriate materials and various appropriate fabricating methods may be used for making the second amorphous silicon layer. For example, an amorphous silicon material may be deposited on the substrate by a plasma-enhanced chemical vapor deposition (PECVD) process and patterned.

Various appropriate crystallization methods may be used for crystallizing the second amorphous silicon layer. Examples of crystallization methods includes excimer laser annealing (ELA), solid phase crystallization (SPC), sequential lateral solidification (SLS), metal induced crystallization (MIC), and metal-induced lateral crystallization (MILC). Optionally, the second amorphous silicon layer is crystallized using an excimer laser annealing process. Because a metal oxide material layer is formed prior to forming the second buffer layer and the second amorphous silicon layer, the heat and hydrogen transfer is much reduced during the crystallization process, e.g., during the application of laser pulse on the second amorphous silicon layer. Defective crystallization can be prevented.

Optionally, the thickness of the polycrystalline silicon layer is in the range of approximately 400 Å to approximately 600 Å, e.g., approximately 400 Å to approximately 450 Å, approximately 450 Å to approximately 500 Å, approximately 500 Å to approximately 550 Å, and approximately 550 Å to approximately 600 Å.

In the present method, the light shielding layer is formed using an amorphous silicon material. As compared to a fabrication method using a metallic material for making the light shielding layer, the present method makes it possible to pattern the first amorphous silicon layer and the polycrystalline silicon layer in a single patterning process (e.g., using a single mask plate), thereby forming the light shielding layer and the active layer in one step.

Optionally, the thickness of the light shielding layer is in the range of approximately 700 Å to approximately 1200 Å, e.g., approximately 700 Å to approximately 800 Å, approximately 800 Å to approximately 900 Å, approximately 900 Å to approximately 1000 Å, approximately 1000 Å to approximately 1100 Å, and approximately 1100 Å to approximately 1200 Å.

FIG. 5 illustrates a correspondence relationship between wavelengths and light transmission rates of amorphous silicon layers of various thicknesses. Referring to FIG. 5, an optimal light shielding result may be obtained when the thickness of the light shielding layer is in a range of approximately 700 Å to approximately 1200 Å in the visible light spectrum, particularly for shielding the blue light.

As compared to a conventional fabrication method, the present method requires a lower number of mask plates as the light shielding layer and the active layer are formed using a single mask plate. A lower cost and a higher fabrication efficiency can be achieved in the present method.

In some embodiments, the method further includes forming a gate electrode, a source electrode, a drain electrode, a gate insulating layer, thereby forming a thin film transistor in the array substrate.

Figure 6A:
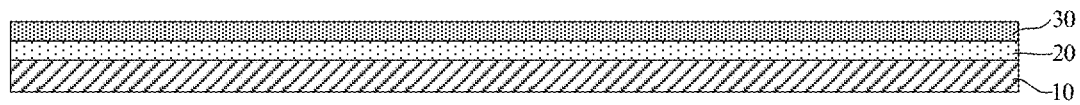
FIGS. 6A to 6F illustrate a process of fabricating an array substrate in some embodiments according to the present disclosure.
Figure 6B:
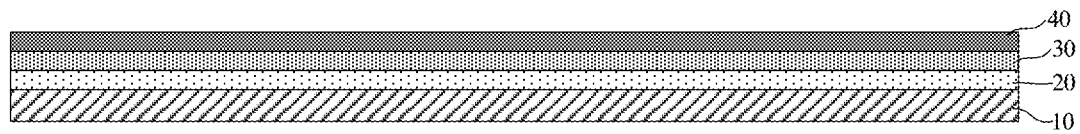
Figure 6C:
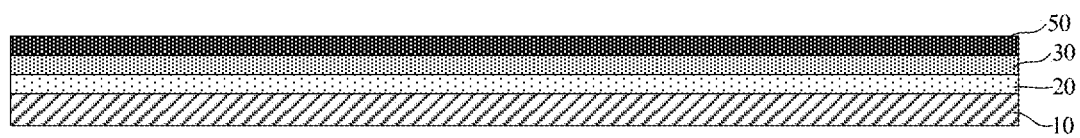
Figure 6D:
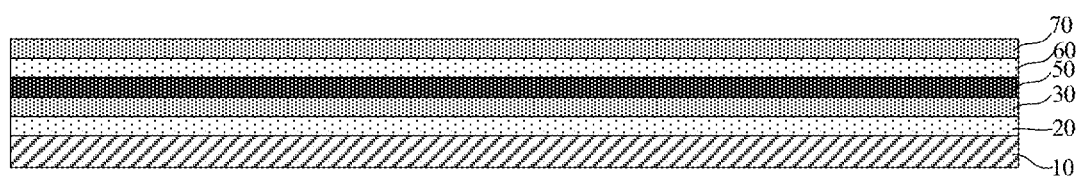
Figure 6E:
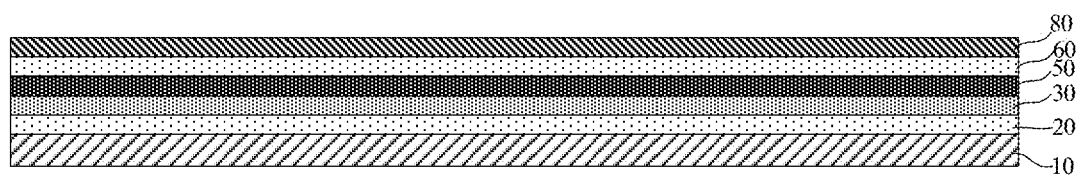
Figure 6F:
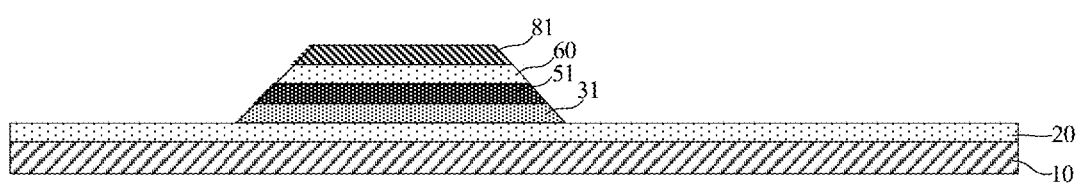

FIGS. 6A to 6F illustrate a process of fabricating an array substrate in some embodiments according to the present disclosure. Referring to FIG. 6A, a first buffer layer 20 is formed on a base substrate 10; and a first amorphous silicon layer 30 is formed on a side of the first buffer layer 20 distal to the base substrate 10. Referring to FIG. 6B, an aluminum layer 40 is formed on a side of the first amorphous silicon layer 30 distal to the first buffer layer 20. Referring to FIG. 6C, the aluminum layer 40 in FIG. 6B is then annealed in an oxygen-containing atmosphere to form a metal oxide material layer 50 (containing aluminum oxide). Referring to FIG. 6D, a second buffer layer 60 is formed on a side of the metal oxide material layer 50 distal to the first amorphous silicon layer 30; and a second amorphous silicon layer 70 is formed on a side of the second buffer layer 60 distal to the metal oxide material layer 50. Referring to FIG. 6E, the second amorphous silicon layer 70 in FIG. 6D is crystallized to form a polycrystalline silicon layer 80. Referring to FIG. 6F, the first amorphous silicon layer 30, the metal oxide material layer 50, and the polycrystalline silicon layer 80 are patterned in a single patterning process using a single mask plate to form the light shielding layer 31, the protective layer 51, and the active layer 81.

In another aspect, the present disclosure provides an array substrate. In some embodiments, and referring to FIG. 6F, the array substrate in some embodiments includes a light shielding layer 31 on a base substrate 10, a protective layer 51 on a side of the light shielding layer 31 distal to the base substrate 10, and an active layer 81 on a side of the protective layer 51 distal to the base substrate 10. Optionally, the light shielding layer 31 is made of amorphous silicon, an orthographic projection of the light shielding layer 31 on the base substrate 10 substantially overlaps with an orthographic projection of the active layer 81 on the base substrate 10. Optionally, the protective layer 51 is made of a metal oxide material, an orthographic projection of the protective layer 51 on the base substrate 10 substantially overlaps with the orthographic projection of the active layer 81 on the base substrate 10, and substantially overlaps with the orthographic projection of the light shielding layer 31 on the base substrate 10. Optionally, the light shielding layer 31 has a thickness in a range of approximately 700 Å to approximately 1200 Å. Optionally, the protective layer 51 has a thickness in a range of approximately 100 Å to approximately 1000 Å.

In some embodiments, the array substrate includes a plurality of thin film transistors. The active layer 81 is a component of the plurality of thin film transistors. Each of the plurality of thin film transistors further includes a gate electrode, a gate insulating layer, a source electrode, and a drain electrode. Optionally, the plurality of thin film transistors are top gate-type thin film transistors, the gate electrode is on a side of the active layer 81 distal to the base substrate 10.

In some embodiments, the array substrate further includes a first buffer layer 20 between the light shielding layer 31 and the base substrate 10. Optionally, the array substrate further includes a second buffer layer 60 between the protective layer 51 and the active layer 81. Optionally, the second buffer layer 60 has a thickness in a range of approximately 1000 Å to approximately 3000 Å.

In another aspect, the present disclosure provides a display apparatus having an array substrate described herein or fabricated by a method described herein. Optionally, the display apparatus is a liquid crystal display apparatus. Optionally, the display apparatus is an organic light emitting diode display apparatus. Optionally, the display apparatus is an electrophoretic display apparatus. Examples of appropriate touch control display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
a base substrate;
a light shielding layer on the base substrate;
a metal oxide layer on a side of the light shielding layer away from the base substrate;
a second buffer layer on a side of the metal oxide layer away from the light shielding layer; and
an active layer on a side of the metal oxide layer away from the base substrate;
wherein the metal oxide layer comprises a metal oxide material;
the light shielding layer comprises amorphous silicon;
the second buffer layer and the metal oxide layer are two discrete layers and comprise different materials, respectively;
an orthographic projection of the light shielding layer on the base substrate covers an orthographic projection of the metal oxide layer on the base substrate;
the orthographic projection of the metal oxide layer on the base substrate covers an orthographic projection of the second buffer layer on the base substrate; and
the orthographic projection of the second buffer layer on the base substrate covers an orthographic projection of the active layer on the base substrate.

2. The array substrate of claim 1, wherein the light shielding layer has a thickness in a range of approximately 700 Å to approximately 1200 Å.

3. The array substrate of claim 1, wherein the metal oxide layer has a thickness in a range of approximately 100 Å to approximately 1000 Å.

4. The array substrate of claim 1, further comprising a first buffer layer between the light shielding layer and the base substrate.

5. The array substrate of claim 4, wherein the first buffer layer comprises one or a combination of silicon oxide and silicon nitride.

6. The array substrate of claim 1, wherein the array substrate comprises a stacked structure comprising the light shield layer, the metal oxide layer, the second buffer layer, and the active layer stacked together;
the metal oxide layer is in direct contact with the light shield layer, the second buffer layer is in direct contact with the metal oxide layer, and the active layer is in direct contact with the second buffer layer; and
a cross-section of the stacked structure has a trapezoidal shape in which widths of the active layer, the second buffer layer, the metal oxide layer, and the light shield layer gradually increase.

7. The array substrate of claim 1, wherein the second buffer layer has a thickness in a range of approximately 1000 Å to approximately 3000 Å.

8. The array substrate of claim 1, wherein the second buffer layer comprises silicon oxide.

9. The array substrate of claim 1, wherein the metal oxide layer comprises aluminum oxide.

10. The array substrate of claim 1, wherein the active layer comprises polycrystalline silicon.

11. A display apparatus, comprising the array substrate of claim 1.

12. A method of fabricating an array substrate, comprising:
forming a first amorphous silicon layer on a base substrate;
forming a metal oxide material layer on a side of the first amorphous silicon layer distal to the base substrate; and
forming a polycrystalline silicon layer on a side of the metal oxide material layer distal to the first amorphous silicon layer
wherein the method comprises forming a stacked structure comprising:
a light shielding layer on the base substrate;
a metal oxide layer on a side of the light shielding layer away from the base substrate;
a second buffer layer on a side of the metal oxide layer away from the light shielding layer; and
an active layer on a side of the metal oxide layer away from the base substrate;
the second buffer layer and the metal oxide layer are two discrete layers and comprise different materials, respectively;
an orthographic projection of the light shielding layer on the base substrate covers an orthographic projection of the metal oxide layer on the base substrate;
the orthographic projection of the metal oxide layer on the base substrate covers an orthographic projection of the second buffer layer on the base substrate; and
the orthographic projection of the second buffer layer on the base substrate covers an orthographic projection of the active layer on the base substrate.

13. The method of claim 12, further comprising patterning the first amorphous silicon layer, the metal oxide material layer, and the polycrystalline silicon layer in a single patterning process, thereby forming a light shielding layer on the base substrate, and an active layer on a side of the light shielding layer distal to the base substrate.

14. The method of claim 12, wherein forming the metal oxide material layer comprises:
forming a metallic material layer on a side of the first amorphous silicon layer distal to the base substrate; and
oxidizing the metallic material layer to form the metal oxide material layer.

15. The method of claim 14, wherein the metallic material layer is made of aluminum, and the metal oxide material layer comprises aluminum oxide.

16. The method of claim 14, wherein oxidizing the metallic material layer comprises annealing the metallic material layer in an oxygen-containing atmosphere.

17. The method of claim 12, prior to forming the first amorphous silicon layer, further comprising forming a first buffer layer on a side first amorphous silicon layer distal to the base substrate.

18. The method of claim 12, wherein forming the polycrystalline silicon layer comprises:
forming a second amorphous silicon layer on a side of the metal oxide material layer distal to the first amorphous silicon layer; and
crystallizing the second amorphous silicon layer to form the polycrystalline silicon layer.

19. The method of claim 18, wherein crystallizing the second amorphous silicon layer is performed by excimer laser annealing.

20. The method of claim 18,
wherein the metal oxide layer is in direct contact with the light shield layer, the second buffer layer is in direct contact with the metal oxide layer, and the active layer is in direct contact with the second buffer layer; and
a cross-section of the stacked structure has a trapezoidal shape in which widths of the active layer, the second buffer layer, the metal oxide layer, and the light shield layer gradually increase.

* * * * *